(12) United States Patent
Koo et al.

(10) Patent No.: US 10,158,076 B2
(45) Date of Patent: Dec. 18, 2018

(54) DISPLAY DEVICE AND A METHOD OF MANUFACTURING THE SAME

(71) Applicant: SAMSUNG DISPLAY CO., LTD., Yongin-si, Gyeonggi-do (KR)

(72) Inventors: Bon Yong Koo, Asan-si (KR); Young Wan Seo, Suwon-si (KR)

(73) Assignee: SAMSUNG DISPLAY CO,. LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/654,149

(22) Filed: Jul. 19, 2017

(65) Prior Publication Data

US 2018/0108843 A1 Apr. 19, 2018

(30) Foreign Application Priority Data

Oct. 19, 2016 (KR) ........................ 10-2016-0135529

(51) Int. Cl.
*G02F 1/136* (2006.01)
*H01L 51/00* (2006.01)
*H01L 51/05* (2006.01)
*G02F 1/1335* (2006.01)
*H01L 27/11* (2006.01)

(52) U.S. Cl.
CPC .... *H01L 51/0023* (2013.01); *G02F 1/133512* (2013.01); *H01L 51/0512* (2013.01); *H01L 27/1108* (2013.01); *H01L 51/0097* (2013.01)

(58) Field of Classification Search
CPC ............. H01L 51/0023; H01L 51/0512; G02F 1/133512

USPC .......................................................... 349/43
See application file for complete search history.

(56) References Cited

U.S. PATENT DOCUMENTS

| | | | |
|---|---|---|---|
| 6,979,242 B2 | 12/2005 | Yu-Chou | |
| 2003/0234971 A1* | 12/2003 | Murade | G02F 1/136209 359/315 |
| 2004/0263748 A1* | 12/2004 | Park | G02F 1/134363 349/141 |
| 2005/0164592 A1 | 7/2005 | Lee | |

(Continued)

FOREIGN PATENT DOCUMENTS

| | | |
|---|---|---|
| JP | 2001-242485 | 9/2001 |
| JP | 2008-015013 | 1/2008 |

*Primary Examiner* — Lucy P Chien
(74) *Attorney, Agent, or Firm* — F. Chau & Associates, LLC

(57) ABSTRACT

The display device includes a first base portion; a semiconductor layer disposed on the first base portion and including a source region, a drain region and a channel region; a first insulating layer disposed on the semiconductor layer; a gate line disposed on the first insulating layer extending in a first direction and overlapping the channel region; a second insulating layer disposed on the gate line; a first connection plug formed in the first and second insulating layer filling a first connection hole exposing the source region; a second connection plug formed in the first and second insulating layer filling a second connection hole exposing the drain region; a first and second conductive pattern disposed on the second insulating layer; a pixel electrode disposed on the second insulating layer and electrically connected to the first conductive pattern; and a data line disposed on the second insulating layer to extend in a second direction.

20 Claims, 11 Drawing Sheets

(56) References Cited

U.S. PATENT DOCUMENTS

| | | | | |
|---|---|---|---|---|
| 2008/0100766 A1* | 5/2008 | Ming | ................ | G02F 1/136227 |
| | | | | 349/44 |
| 2008/0117344 A1* | 5/2008 | Kim | ................. | G02F 1/136259 |
| | | | | 349/39 |
| 2010/0012939 A1* | 1/2010 | Ishii | ................. | G02F 1/136213 |
| | | | | 257/59 |
| 2010/0096634 A1* | 4/2010 | Park | ....................... | H01L 27/12 |
| | | | | 257/59 |
| 2012/0229438 A1* | 9/2012 | Fujita | ................... | G09G 3/3233 |
| | | | | 345/211 |
| 2013/0299818 A1* | 11/2013 | Tanaka | ................... | H01L 29/78 |
| | | | | 257/43 |

\* cited by examiner

DISPLAY DEVICE AND A METHOD OF MANUFACTURING THE SAME

CROSS-REFERENCE TO RELATED APPLICATION

This application claims priority under 35 U.S.C. § 119 to Korean Patent Application No. 10-2016-0135529 filed on Oct. 19, 2016 in the Korean Intellectual Property Office, the disclosure of which is incorporated by reference herein in its entirety.

TECHNICAL FIELD

Exemplary embodiments of the inventive concept relate to a display device, and more particularly to a method of manufacturing the same.

DISCUSSION OF RELATED ART

A liquid crystal display device includes electric field generating electrodes, two substrates, and a liquid crystal layer. The electric field generating electrodes may include a pixel electrode and a common electrode. The liquid crystal layer is disposed between the two substrates. In the liquid crystal display device, an electric field is applied to the two electric field generating electrodes, and the intensity of the electric field is adjusted to adjust the amount of light transmitted from an external light source to the substrate. Thus, a desired image signal is provided.

The pixel electrode of the liquid crystal display device is connected to a switching element such as a thin film transistor to receive a voltage.

The resolution of the liquid crystal display devices is increasing. Thus, the number of pixel regions per unit area increases and the size of the pixel region where the pixel electrodes are disposed become smaller.

SUMMARY

Exemplary embodiments of the present invention provide a display device. The display device includes a first base portion, a semiconductor layer, a first insulating layer, a gate line, a second insluting layer, a first connection plug, a second connection plug, a first conductive pattern, a second conductive pattern, a pixel electrode, and a data line. The semiconductor layer is disposed on the first base portion and includes a source region, a drain region and a channel region. The first insulating layer is disposed on the semiconductor layer. The gate line is disposed on the first insulating layer and overlaps the channel region. The gate line extends in a first direction. The second insulating layer is disposed on the gate line. The first connection plug is formed in the first insulating layer and the second insulating layer. The first connection plug filling a first connection hole exposing the source region. The second connection plug is formed in the first insulating layer and the second insulating layer. The second connection plug filling a second connection hole exposing the drain region. The first conductive pattern is disposed on the second insulating layer. The first conductive pattern is connected to the first connection plug. The second conductive pattern is disposed on the second insulating layer. The second conductive pattern is connected to the second connection plug. The second conductive pattern is spaced apart from the first conductive pattern. The pixel electrode is disposed on the second insulating layer. The pixel electrode is electrically connected to the first conductive pattern. The data line is disposed on the second insulating layer. The data line extends in a second direction intersecting the first direction. The data line is electrically connected to the second conductive pattern. The first connection plug and the second connection plug are spaced apart from each other in the second direction. The gate line is disposed between the first connection plug and the second connection plug.

Exemplary embodiments of the present invention provide a method of manufacturing a display device. The method of a display device includes forming a semiconductor layer on a first base portion. The semiconductor layer includes a source region, a drain region and a channel region. A first insulating layer is formed on the semiconductor layer. A gate line is formed on the first insulating layer and overlaps the channel region. The gate line extends in a first direction. A second insulating layer is formed on the gate line. A first connection hole exposing the source region is formed in the first insulating layer and the second insulating layer. A second connection hole exposing the drain region is formed in the first insulating layer and the second insulating layer. A first connection plug is formed. The first connection plug is configured to fill the first connection hole. A second connection plug is formed. The second connection plug is configured to fill the second connection hole using a damascene method. A first conductive pattern connected to the first connection plug is formed. A second conductive pattern connected to the second connection plug is formed. A data line is formed on the second insulating layer. The data line is configured to be connected to the first conductive pattern. The data line extends in a second direction intersecting the first direction. An organic layer is formed on the second insulating layer. The organic layer includes an opening exposing the second connection plug. A pixel electrode is formed on the organic layer. The pixel electrode is configured to be connected to the second connection plug. The first connection plug and the second connection plug are spaced apart from each other in the second direction. The gate line is disposed between the first connection plug and the second connection plug.

Exemplary embodiments of the present invention provide a display device. The display device includes a first base portion, a semiconductor layer, a first insulating layer, a gate line, a second insulating layer, a first connection plug, a second connection plug, a first conductive pattern, and a second conductive pattern. The semiconductor layer is disposed on the first base portion. The semiconductor layer includes a source region, a drain region, and a channel region. The first insulating layer is disposed on the semiconductor layer. The gate line is disposed on the first insulating layer. The second insulating layer is disposed on the gate line. The first connection plug is formed in the first insulating layer and the second insulating layer. The second connection plug is formed in the first insulating layer and the second insulating layer. The first conductive patter is disposed on the second insulating layer. The second conductive pattern is disposed on the second insulating layer and is spaced apart from the first conductive pattern. An upper surface of the first connection plug and an upper surface of the second connection plug are located on substantially a same plane as an upper surface of the second insulating layer. The first connection plug and the second connection plug each include a first conductive material. The first conductive pattern and the second conductive pattern each include a second conductive material. The data line includes a third conductive material. The third conductive material is different from the second conductive material.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION OF THE EMBODIMENTS

Figure 1:
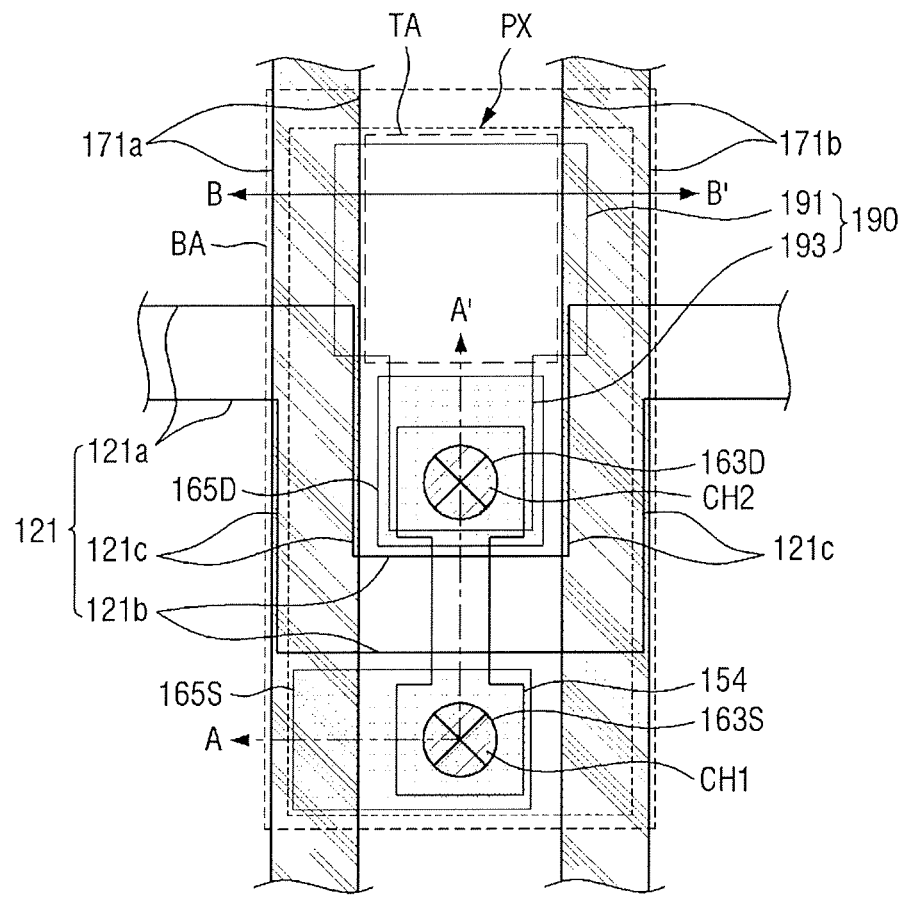
FIG. 1 is a schematic plan view illustrating a pixel of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Exemplary embodiments of the present invention may be described in terms of a liquid crystal display device; however, exemplary embodiments of the present invention are not limited thereto. For example, exemplary embodiments of the present invention may be applied to an organic light-emitting display device.

Figure 2:
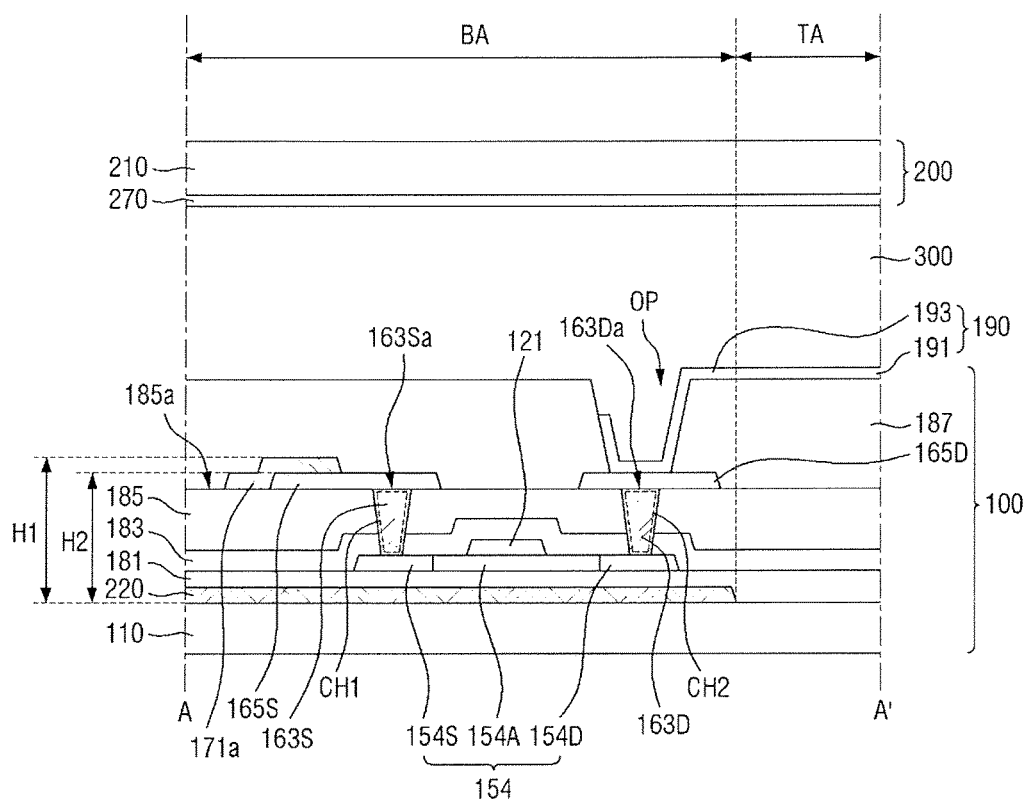
FIG. 2 is a cross-sectional view illustrating a display device taken along a line A-A' of FIG. 1 according to an exemplary embodiment of the present invention.
Figure 3:
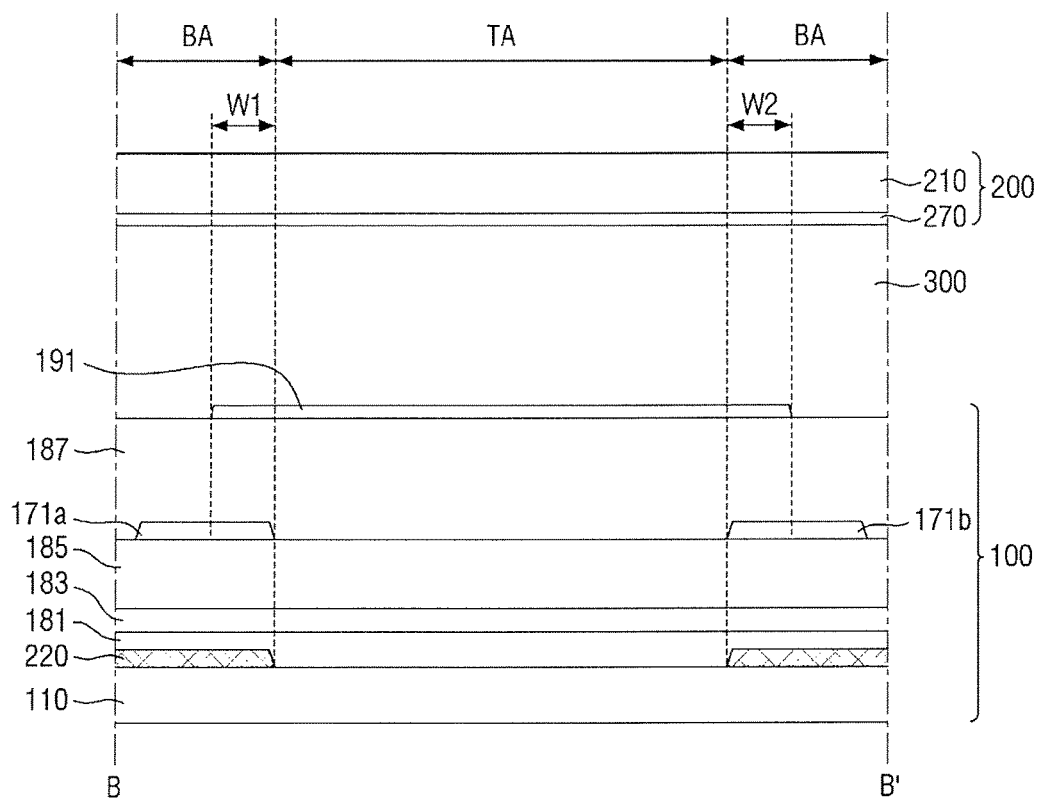
FIG. 3 is a cross-sectional view illustrating a display device taken along a line B-B' of FIG. 1 according to an exemplary embodiment of the present invention.

FIG. 1 is a schematic plan view illustrating a pixel of a display device according to an exemplary embodiment of the present invention. FIG. 2 is a cross-sectional view illustrating a display device taken along a line A-A' of FIG. 1 according to an exemplary embodiment of the present invention. FIG. 3 is a cross-sectional view illustrating a display device taken along a line B-B' of FIG. 1 according to an exemplary embodiment of the present invention.

Referring to FIGS. 1 to 3, a display device may include a first display substrate 100, a second display substrate 200, and a liquid crystal layer 300. The second display substrate 200 may face the first display substrate 100. The liquid crystal layer 300 may be disposed between the first display substrate 100 and the second display substrate 200. The display device may further include a polarization unit. The polarization unit may be included in the first display substrate 100 or the second display substrate 200. Alternatively, the polarization unit may be provided separately. The display device may further include a backlight unit. The backlight unit may be disposed below the first display substrate 100.

The first display substrate 100 may be an array substrate. Pixels PX may be formed on the array substrate. The pixels PX may include elements (e.g., switching elements such as thin film transistors), for example, for driving liquid crystal molecules of the liquid crystal layer 300.

The second display substrate 200 may be a substrate (e.g., an opposite substrate). The second display substrate 200 may be disposed to face the first display substrate 100.

Hereinafter, the first display substrate 100 will be described in more detail.

A first base portion 110 may be an insulating substrate. The insulating substrate may be transparent. For example, the first base portion 110 may be include a glass substrate, a quartz substrate, a transparent resin substrate, or the like. Further, the first base portion 110 may include a polymer or a plastic. The polymer or plastic may have a relatively high heat resistance. In some exemplary embodiments of the present invention, the first base portion 110 may be flexible. For example, the first base portion 110 may be a substrate that can be deformed by rolling, folding, bending, or the like. When the first base portion 110 is flexible, a first substrate 111 may include a soft transparent insulating material. For example, the soft transparent insulating material may include polyimide (PI), polyetherimide (PEI), polyethylene terephthalate (PET), polycarbonate (PC), polymethyl methacrylate (PMMA), polystyrene (PS), styrene acrylonitrile copolymer (SAN), silicone-acrylic resin, or the like.

The first base portion 110 may include a light-transmitting area TA and a light blocking area BA. The light-transmitting area TA may be an area in which light is transmitted to display an image. The light may be provided by a backlight unit. The backlight unit may be disposed below the first base portion 110. The light blocking area BA may be an area in which light provided by the backlight unit is partially or fully blocked.

A light shielding layer 220 may be disposed on the first base portion 110. The light shielding layer 220 may block or absorb externally introduced light. The light shielding layer 220 may be disposed to overlap the light blocking area BA of the first base portion 110.

The light shielding layer 220 may include an opaque metal. The opaque metal may be a light absorbing metal or an alloy thereof. The opaque metal may have a black-based color. For example, the light shielding layer 220 may include molybdenum (Mo), chromium (Cr), titanium (Ti), niobium (Nb), manganese (Mn) and tantalum (Ta), and/or an alloy thereof. However, the exemplary embodiments of the present invention are not limited thereto. The light shielding layer 220 may include other metals able to absorb light.

A buffer layer 181 may be disposed on the first base portion 110. The buffer layer 181 may cover the light shielding layer 220. The buffer layer 181 may prevent penetration of impurity elements into the display device. The buffer layer 181 may also planarize a surface of the display device. The buffer layer 181 may include various materials able to prevent impurity elements from penetrating into the display device and to planarize the surface of the display device. For example, the buffer layer 181 may include at least one of silicon nitride ($SiN_x$), silicon oxide ($SiO_2$), and/or silicon oxynitride ($SiO_xN_y$).

A semiconductor layer 154 may be disposed on the buffer layer 181. The semiconductor layer 154 may be disposed to overlap the light shielding layer 220. Thus, light introduced into the semiconductor layer 154 may be blocked. Additionally, a leakage current caused, for example, by the light introduced into the semiconductor layer 154 may be prevented. The semiconductor layer 154 may include at least one semiconductor material. The semiconductor material may include a polycrystalline silicon, an amorphous silicon and/or an oxide semiconductor. Further, the semiconductor layer 154 may include a channel region 154A, a source region 154S, and a drain region 154D. The channel region 154A might not be doped with impurities. The source region 154S and the drain region 154D may be formed, for example, by doping impurities on both sides of the channel region 154A. The impurity may be changed, for example, depending on the type of thin film transistor. The impurity may be an N-type impurity or a P-type impurity.

A first insulating layer 183 may be disposed on the semiconductor layer 154. The first insulating layer 183 may cover the semiconductor layer 154. The first insulating layer 183 may insulate the semiconductor layer 154 from a gate line 121. The first insulating layer 183 may include an inorganic material such as silicon nitride (SiNx), silicon oxide ($SiO_2$), silicon oxynitride (SiOxNy) or tetra ethyl ortho silicate (TEOS). The first insulating layer 183 may have a single layer structure or a multi-layered structure.

The gate line 121 may be disposed on the first insulating layer 183. The gate line 121 may transmit a gate signal. The gate line 121 may extend substantially in a single direction. Hereinafter, the gate line 121 extending in a horizontal direction or a first direction D1 will be described in more detail below. For example, the entire gate line 121 may extend substantially in the first direction D1. Alternatively, the entire gate line 121 may extend along the first direction D1 and a part of the gate line 121 might not be parallel to the first direction D1. A gate electrode 124 may protrude from the gate line 121. The gate electrode 124 may be connected to the gate line 121. In some exemplary embodiments of the present invention, the gate line 121 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), or the like.

The gate line 121 may have a zigzag shape while extending in the first direction D1. The gate line 121 may include a first portion 121a a second portion 121b, and a third portion 121c. The first portion 121a may extend substantially parallel to the first direction D1. The second portion 121b may extend substantially parallel to the first direction D1. The second portion 121b may be spaced apart from the first portion 121a. The third portion 121c may connect the first portion 121a to the second portion 121b. In some exemplary embodiments of the present invention, the second portion 121b may overlap a first data line 171a or a second data line 171b.

The gate line 121 may overlap the channel region 154A of the semiconductor layer 154 while extending in the first direction D1. The third portion 121c of the gate line 121 may overlap the channel region 154A of the semiconductor layer 154; however, exemplary embodiments of the present invention are not limited thereto. For example, the first portion 121a may overlap the channel region 154A of the semiconductor layer 154. A portion of the gate line 121 overlapping the channel region 154A of the semiconductor layer 154 may be as a gate electrode of a thin film transistor.

A second insulating layer 185 may be disposed on the gate line 121. The second insulating layer 185 may include an insulating material. The insulating material may be an inorganic material such as silicon nitride (SiNx), silicon oxide ($SiO_2$), silicon oxynitride (SiOxNy), or the like.

A first connection hole CH1 and a second connection hole CH2 may be formed in the first insulating layer 183 and the second insulating layer 185, respectively. The first connection hole CH1 may expose the source region 154S of the semiconductor layer 154. The second connection hole CH2 may expose the drain region 154D of the semiconductor layer 154. The gate line 121 may be disposed between the first connection hole CH1 and the second connection hole CH2. The first connection hole CH1 and the second connection hole CH2 may be spaced from each other along a second direction D2. The second direction D2 may intersect the first direction D1. The gate line 121 may be disposed between the first connection hole CH1 and the second connection hole CH2.

A first connection plug 163S may be disposed in the first connection hole CH1. A second connection plug 163D may be disposed in the second connection hole CH2.

The first connection plug 163S may fill an inside of the first connection hole CH1. The first connection plug 163S may be connected to the source region 154S of the semiconductor layer 154. The source region 154S may be exposed through the first connection hole CH1. Further, the second connection plug 163D may fill an inside of the second connection hole CH2. The second connection plug 163D may be connected to the drain region 154D of the semiconductor layer 154. The drain region 1544D may be exposed through the second connection hole CH2. For example, the first connection plug 163S may be a source electrode of the thin film transistor. The second connection plug 163D may be a drain electrode of the thin film transistor. The first connection plug 163S and the second connection plug 163D may each include a first conductive material. The first conductive material may have a relatively high electrical conductivity. The first conductive material may also have a relatively low electrical resistance. For example, the first connection plug 163S and the second connection plug 163D may each include a relatively low-resistance metal material such as tungsten, tantalum, aluminum, copper, silver, or molybdenum. In some exemplary embodiments of the present invention, the first connection plug 163S and the second connection plug 163D may each include copper.

An upper surface 163Sa of the first connection plug 163S and an upper surface 163Da of the second connection plug 163D might not protrude upward from an upper surface 185a of the second insulating layer 185. In some exemplary embodiments of the present invention, the upper surface 185a of the second insulating layer 185, the upper surface 163Sa of the first connection plug 163S and the upper surface 163Da of the second connection plug 163D may be disposed on substantially the same plane. Thus, a height from an upper surface of the first base portion 110 to the upper surface 185a of the second insulating layer 185, a height from the upper surface of the first base portion 110 to the upper surface 163Sa of the first connection plug 163S, and a height from the upper surface of the first base portion 110 to the upper surface 163Da of the second connection plug 163D may be substantially the same.

In some exemplary embodiments of the present inventive concept, each of the first connection plug 163S and the second connection plug 163D may have a single damascene structure.

In a plan view, the gate line 121 may be disposed between the first connection hole CH1 and the second connection hole CH2. The first connection hole CH1 and the second connection hole CH2 may be spaced apart from each other along the second direction D2. The second direction D2 may intersect the first direction D1. The gate line 121 may be disposed between the first connection hole CH1 and the second connection hole CH2. Since the first connection plug 163S may fill the inside of the first connection hole CH1 and the second connection plug 163D may fill the inside of the second connection hole CH2, the gate line 121 may be disposed between the first connection plug 163S and the second connection plug 163D in a plan view. Additionally, the first connection plug 163S and the second connection plug 163D may be spaced from each other along the second direction D2. The second direction D2 may intersect the first direction D1. The gate line 121 may be disposed between the first connection plug 163S and the second connection plug 163D.

The semiconductor layer 154, a portion of the gate line 121 overlapping the channel region 154A of the semiconductor layer 154, the first connection plug 163S and the second connection plug 163D may form a thin film transistor. The thin film transistor may be a switching element.

A first conductive pattern 165S and a second conductive pattern 165D may be disposed on the second insulating layer 185. The first conductive pattern 165S may overlap the first connection plug 163S. The first conductive pattern may be in direct contact with the first connection plug 163S. The second conductive pattern 165D may overlap the second connection plug 163D. The second conductive pattern 165D may be in direct contact with the second connection plug 163D. The first conductive pattern 165S and the second conductive pattern 165D may be spaced apart from each other.

The first conductive pattern 165S and the second conductive pattern 165D may each include a second conductive material. For example, the second conductive material may be a transparent conductive material, for example, amorphous indium tungsten oxide (a-ITO) or poly indium tungsten oxide (poly-ITO). The second conductive material may be different than a third conductive material. The third conductive material may form the data lines 171a and 171b. For example, the second conductive material may be a material having an etching rate or etching condition different from an etching rate or etching condition of the third conductive material. The second conductive material may be a material different from a material of the first conductive material included in the first connection plug 163S and the second connection plug 163D.

The first data line 171a and the second data line 171b may extend along the second direction D2. The first data line 171a and the second data line 171b may intersect the gate line 121. The first data line 171a and the second data line 171b may be disposed on the second insulating layer 185. A data voltage may be applied to each of the first data line 171a and the second data line 171b.

At least a part of the first data line 171a may be disposed on the first conductive pattern 165S. At least a part of the first data line 171a may be in direct contact with and electrically connected to the first conductive pattern 165S. The first data line 171a may be partially disposed on the first conductive pattern 165S. Accordingly, a maximum height H1 of the first conductive pattern 165S measured with respect to the upper surface of the first base portion 110 may be smaller than a maximum height H2 of the first data line 171a measured with respect to the upper surface of the first base portion 110.

The first data line 171a may include a third conductive material. The third conductive material may have a relatively high electrical conductivity. The third conductive material may also have a relatively low electrical resistance. For example, the first data line 171a may include, as the third conductive material, a relatively low-resistance metal material such as tungsten, tantalum, aluminum, copper, silver, or molybdenum. In some exemplary embodiments of the present invention, the first data line 171a may include substantially the same material as the first connection plug 163S and the second connection plug 163D.

The third conductive material included in the first data line 171a may be a material different from a material of the second conductive material included in the first conductive pattern 165S and the second conductive pattern 165D. For example, the third conductive material may be a material having an etching rate higher than an etching rate of the second conductive material. Under substantially the same etching conditions, the third conductive material may have a faster etching rate than the second conductive material. Alternatively, the third conductive material and the second conductive material may be materials having different etching conditions. For example, when using substantially the same etchant, the third conductive material may be etched and the second conductive material might not be etched.

An organic layer 187 may be disposed on the second insulating layer 185, the first conductive pattern 165S, and the second conductive pattern 165D. In some exemplary embodiments of the present invention, the organic layer 187 may be a planarizing film. The organic layer 187 may include an organic material. The organic material may be a photosensitive organic material.

In some exemplary embodiments of the present invention, the organic layer 187 may be a color filter. The color filter may display, for example, one of a set of primary colors, such as three primary colors of red, green and blue. However, exemplary embodiments of the present invention are not limited thereto. For example, the color filter may display cyan, magenta, yellow or white-based colors. The organic layer 187 not being a color filter will be described in more detail below; however, exemplary embodiments of the present invention are not limited thereto.

An opening OP may be formed in the organic layer 187. The opening OP may expose the second conductive pattern 165D.

A pixel electrode 190 may be disposed on the organic layer 187. The pixel electrode 190 may include a body portion 191 and an extended portion 193. The body portion 191 may overlap the light transmitting area TA. The extended portion 193 may extend from the body portion 191. The extended portion 193 may overlap the light blocking area BA. The extended portion 193 may be physically and/or electrically connected to the second conductive pattern 165D, for example, through the opening OP. The pixel electrode 190 may include a transparent conductive material such as ITO, IZO, ITZO, or AZO.

In some exemplary embodiments of the present invention, the body portion 191 of the pixel electrode 190 may overlap the data lines 171a and 171b. The body portion 191 of the pixel electrode 190 may overlap the first data line 171a and the second data line 171b.

An overlapping width W1 between the body portion 191 of the pixel electrode 190 and the first data line 171a may be substantially the same as an overlapping width W2 between the body portion 191 of the pixel electrode 190 and the second data line 171b. Accordingly, a parasitic capacitance generated between the first data line 171a and the pixel electrode 190 and a parasitic capacitance generated between the second data line 171b and the pixel electrode 190 may be offset from each other. Thus, a deterioration in quality of the display device, for example, due to the parasitic capacitance may be reduced or prevented. However, exemplary embodiments of the present invention are not limited thereto. For example, the pixel electrode 190 might not overlap the first data line 171a and the second data line 171b.

The second display substrate 200 will be described in more detail below.

The second display substrate 200 may include a second base portion 210 and a common electrode 270.

The second base portion 210 may include a transparent insulating substrate. The transparent insulating substrate may be substantially similar to the transparent insulating substrate included in the first base portion 110. The second base portion 210 may include a polymer or a plastic. The polymer or plastic may have a relatively high heat resistance. In some exemplary embodiments of the present invention, the second base portion 210 may be flexible.

The common electrode 270 may be disposed on a surface of the second base portion 210 facing the first display substrate 100. The common electrode 270 may include a transparent conductive material such as ITO or IZO. In some exemplary embodiments of the present invention, the common electrode 270 may be disposed over substantially the entire surface of the second insulating substrate 210. A common voltage Vcom may be applied to the common electrode 270, for example, to form an electric field in cooperation with the pixel electrode 190.

The liquid crystal layer 300 will be described in more detail below.

The liquid crystal layer 300 may include a plurality of liquid crystal molecules. The liquid crystal molecules may have dielectric anisotropy. When an electric field is applied between the first display substrate 100 and the second display substrate 200, the liquid crystal molecules may rotate in a direction between the first display substrate 100 and the second display substrate 200. Thus, light may be blocked or transmitted. The term "rotation" may refer to the liquid crystal molecules physically rotating. The term "rotation" may also refer to the arrangement of the liquid crystal molecules being changed by the electric field in some other manner. In some exemplary embodiments of the present invention, the liquid crystal layer 300 may include reactive mesogens. The reactive mesogens may undergo polymerization by light such as ultraviolet light. Alternatively, the liquid crystal layer 300 may include a pre-tilt providing polymer. The pre-tilt providing polymer may be formed by polymerization of reactive mesogens. The pre-tilt providing polymer may provide a pre-tilt to the liquid crystal molecules even when the electric field is not formed between the first display substrate 100 and the second display substrate 200.

Since a part of the gate line 121 may be a gate electrode without forming a separate gate electrode protruding from the gate line 121, an area occupied by the thin film transistor may be reduced. Further, since the upper surface 185a of the second insulating layer 185, the upper surface 163Sa of the first connection plug 163S, and the upper surface 163Da of the second connection plug 163D are positioned on substantially the same plane, a flatness of the display device may be increased. Thus, the display device may be thinner. Further, since the first connection plug 163S and the first data line 171a may be electrically connected to each other via the first conductive pattern 165S. The electrical connection between the first data line 171a and the first connection plug 163S may be performed with relative ease, for example, even if the first connection plug 163S fills the first connection hole CH1. Since the second connection plug 163D and the pixel electrode 190 may be electrically connected to each other via the second conductive pattern 165D, the size of the opening OP may be reduced. Thus, the second connection plug 163D and the pixel electrode 190 may be electrically connected with relative ease despite the reduced size of the opening OP is reduced. The second connection plug 163D and the pixel electrode 190 may be electrically connected although the opening OP is not formed to overlap the second connection plug 163D according to the alignment margin. Thus, a reliability of the display device may be increased.

FIGS. 4 to 16 are cross-sectional views illustrating a method of manufacturing a display device of FIG. 1 according to an exemplary embodiment of the present invention.

Figure 4:
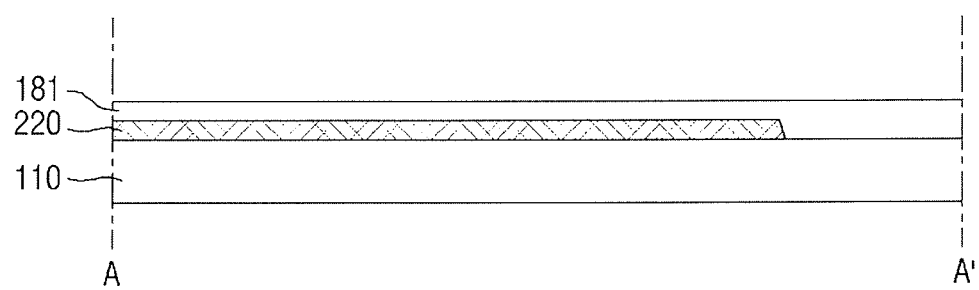
FIGS. 4 to 16 are cross-sectional views illustrating a method of manufacturing the display device of FIG. 1 according to an exemplary embodiment of the present invention.

Referring to FIG. 4, the light shielding layer 220 may be disposed on the first base portion 110. The buffer layer 181 may be disposed on the light shielding layer 220.

Figure 5:
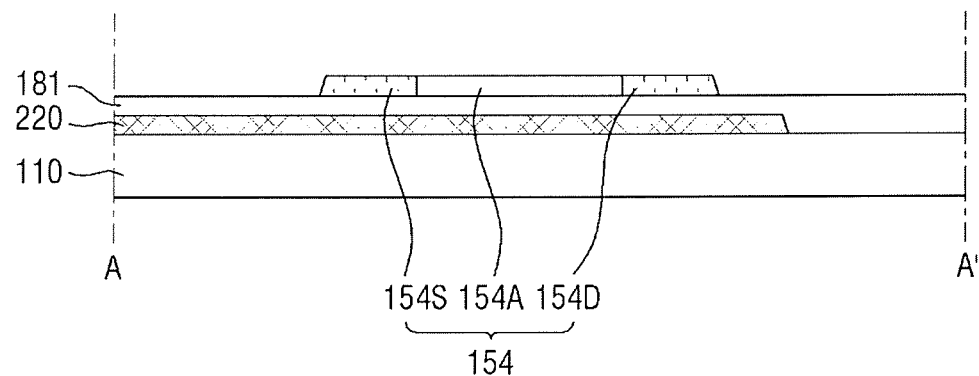

Referring to FIG. 5, the semiconductor layer 154 overlapping the light shielding layer 220 may be disposed on the buffer layer 181. The semiconductor layer 154 may include the source region 154S, the drain region 154D and the channel region 154A. The source region 154S and the drain region 154D may be formed, for example, by doping impurity ions.

Figure 6:
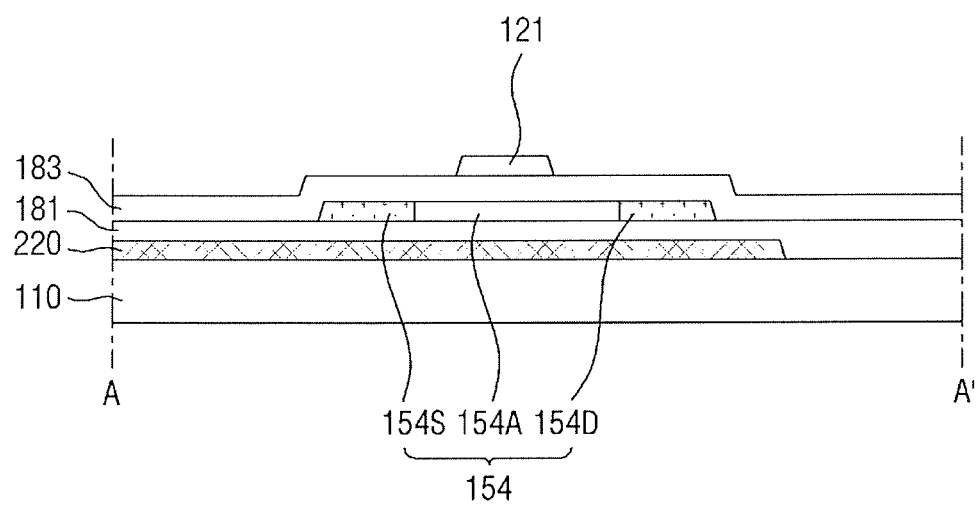

Referring to FIG. 6, the first insulating layer 183 may be disposed on the semiconductor layer 154 and the buffer layer 181. The first insulating layer 183 may include an inorganic material such as silicon nitride (SiNx), silicon oxide ($SiO_2$) or silicon oxynitride (SiOxNy). In some exemplary embodiments of the present invention, the first insulating layer 183 may be formed, for example, by a high density plasma (HDP) method.

The gate line 121 may be disposed on the first insulating layer 183. The gate line 121 may be formed in a zigzag shape while extending in the first direction D1 of FIG. 1. The gate line 121 may overlap the channel region 154A of the semiconductor layer 154.

Figure 7:
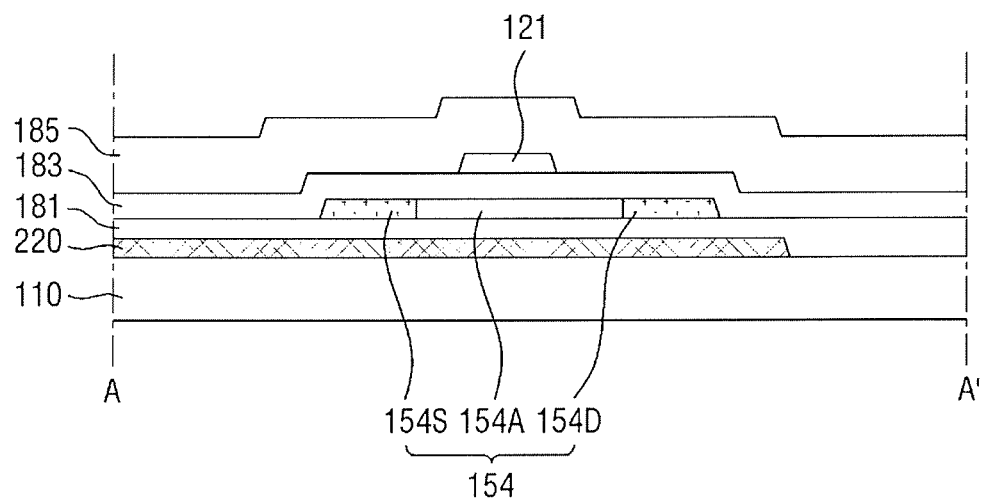

Referring to FIG. 7, the second insulating layer 185 may be disposed on the first insulating layer 183. The second insulating layer 185 may cover the gate line 121. The second insulating layer 185 may include an inorganic material such as silicon nitride (SiNx), silicon oxide ($SiO_2$) or silicon oxynitride (SiOxNy). In some exemplary embodiments of the present invention, the second insulating layer 185 may be formed by, for example, a plasma CVD method.

Figure 8:
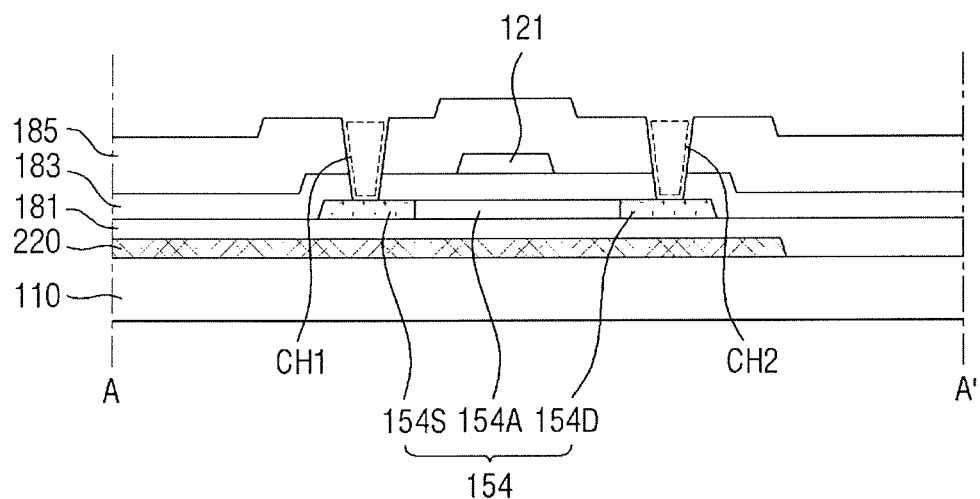

Referring to FIG. 8, the first connection hole CH1 and the second connection hole CH2 154D may be disposed in the first insulating layer 183 and the second insulating layer 185, respectively. The first connection hole CH1 may expose the source region 154S. The second connection hole CH2 may expose the drain region 154D. The first connection hole CH1 and the second connection hole CH2 may be spaced apart from each other along the second direction D2. The gate line 121 may be disposed between the first connection hole CH1 and the second connection hole CH2 as illustrated in FIG. 1.

Figure 9:
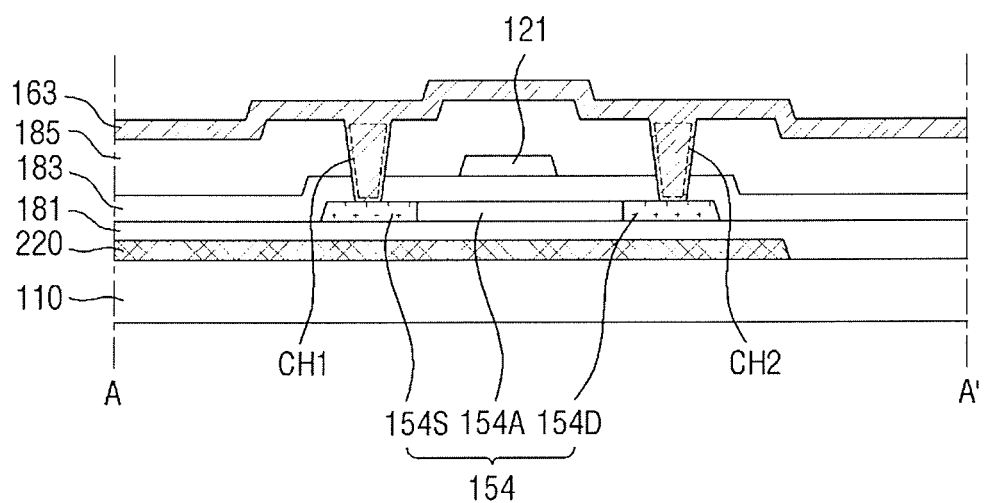

Referring to FIG. 9, a first conductive material may be disposed on the second insulating layer 185 until the first connection hole CH1 and the second connection hole CH2 are filled. Thus, a first conductive material layer 163 may be formed. The first conductive material layer 163 may include a relatively low-resistance metal material such as tungsten, tantalum, aluminum, copper, silver, or molybdenum.

Figure 10:
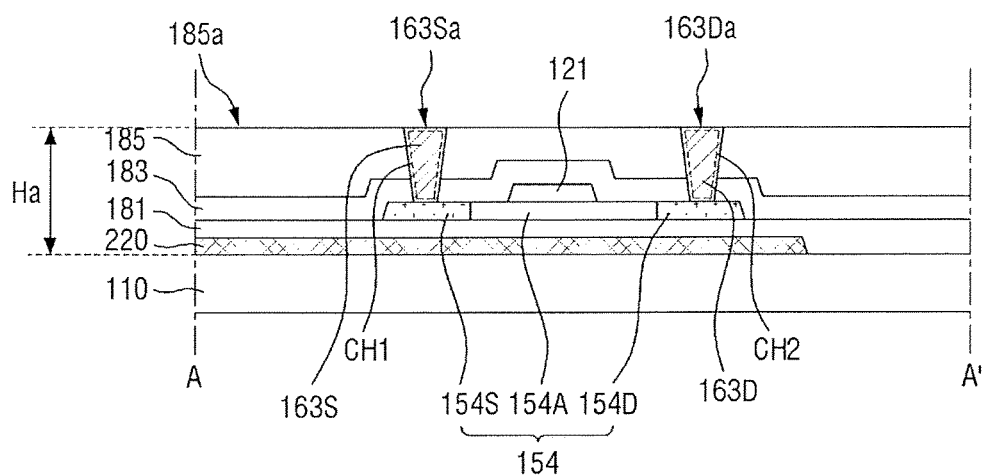

Referring to FIG. 10, when the first conductive material layer 163 disposed on the second insulating layer 185 is removed, for example, by chemical mechanical polishing (CMP), the first connection plug 163S filled in the first connection hole CH1 and the second connection plug 163D filled in the second connection hole CH2 may be formed. Thus, the first connection plug 163S and the second connection plug 163D may be using a damascene process. The first connection hole CH1 and the second connection hole CH2 may be spaced apart from each other along the second direction D2. The gate line 121 may be disposed between the first connection hole CH1 and the second connection hole CH2 as illustrated in FIG. 1. Accordingly, the first connection plug 163S and the second connection plug 163D may be formed spaced apart from each other along the second direction D2. The gate line 121 may be disposed between the first connection plug 163S and the second connection plug 163D as illustrated in FIG. 1.

In the chemical mechanical polishing CMP process of the first conductive material layer 163, the second insulating layer 185 may also be polished. Thus, an upper surface of the second insulating layer 185 may be planarized. Accordingly, the upper surface 185a of the second insulating layer 185, the upper surface 163Sa of the first connection plug 163S and the upper surface 163Da of the second connection plug 163D may be disposed on substantially the same plane. Further, the height from the upper surface of the first base portion 110 to the upper surface 185a of the second insulating layer 185, the height from the upper surface of the first base portion 110 to the upper surface 163Sa of the first connection plug 163S, and the height from the upper surface of the first base portion 110 to the upper surface 163Da of the second connection plug 163D may have substantially the same value Ha.

In some exemplary embodiments of the present invention, the surface of the second insulating layer 185 may be planarized by chemical mechanical polishing. Then, the first connection hole CH1 and the second connection hole CH2 may be formed. A chemical mechanical polishing operation may be further performed after the first conductive material layer 163 is formed.

Figure 11:
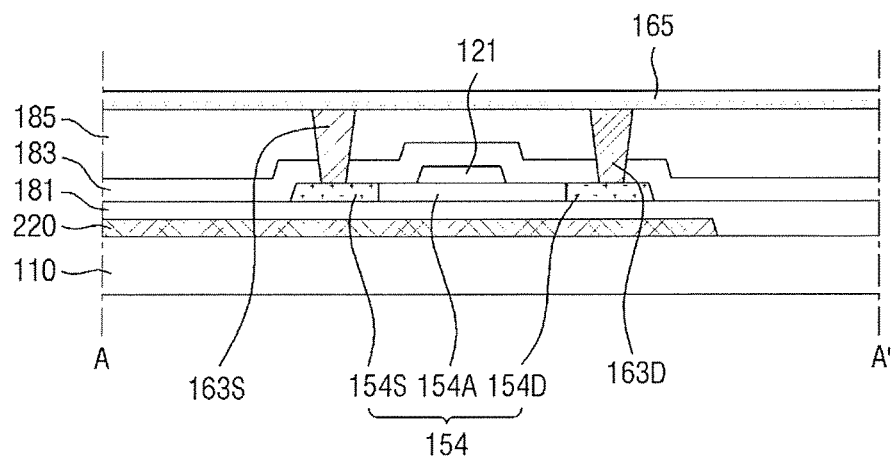

Referring to FIG. 11, a second conductive material layer 165 may be disposed on the second insulating layer 185. The second conductive material layer 165 may include the second conductive material. The second conductive material may be a transparent conductive material such as amorphous indium tin oxide (a-ITO) or poly indium tungsten oxide (poly-ITO).

Figure 12:
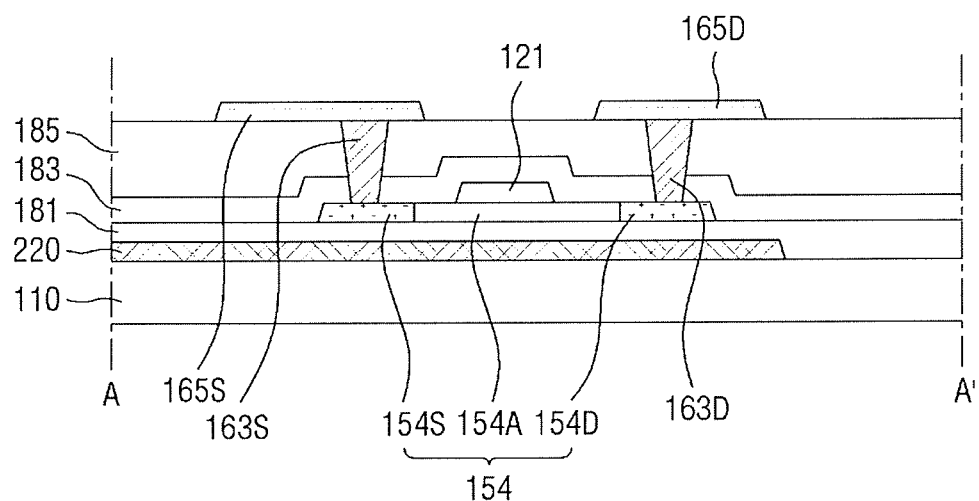
Figure 13:
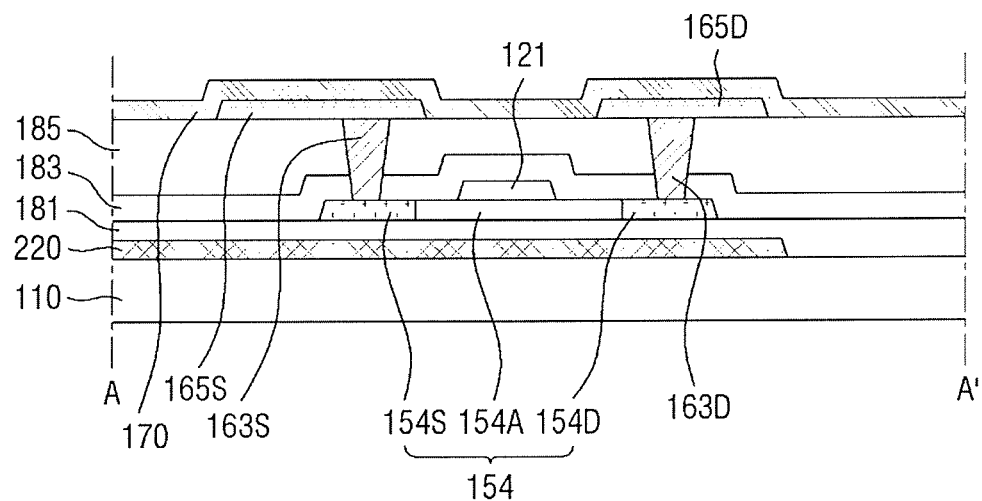

The second insulating layer 185 may be patterned to form the first conductive pattern 165S and the second conductive pattern 165S. The first conductive pattern 165S may be in contact with the first connection plug 163S. The second conductive pattern 165D may be separated from the first conductive pattern 165S. The second conductive pattern 165D may be in contact with the second connection plug 163D as illustrated in FIG. 12.

A third conductive material layer 170 may be disposed on the second insulating layer 185 on which the first conductive pattern 165S and the second conductive pattern 165D are formed. The third conductive material layer 170 may include a third conductive material. The third conductive material may include a relatively low-resistance metal material such as tungsten, tantalum, aluminum, copper, silver, or molybdenum. The third conductive material may be a material different from a material of the second conductive material included in the first conductive pattern 165S and the second conductive pattern 165D. The third conductive material may have etching characteristics (etching rate, etching conditions, etchant, etc.) different from etching characteristics of the second conductive material.

Figure 14:
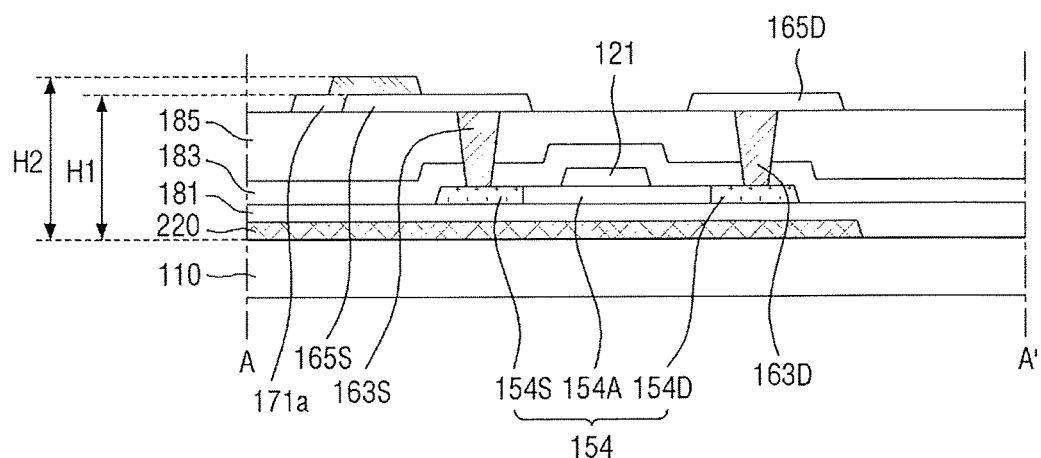

The third conductive material layer 170 may be patterned to form the first data line 171a as illustrated in FIG. 14. Since the third conductive material and the second conductive material may have different etching characteristics, in the process of patterning the third conductive material layer 170, the first conductive pattern 165S and the second conductive pattern 165D might not be etched.

The first data line 171a may be partially disposed on the first conductive pattern 165S. Accordingly, the maximum height H1 of the first conductive pattern 165S measured with respect to the upper surface of the first base portion 110 may be smaller than the maximum height H2 of the first data line 171a measured with respect to the upper surface of the first base portion 110.

Figure 15:
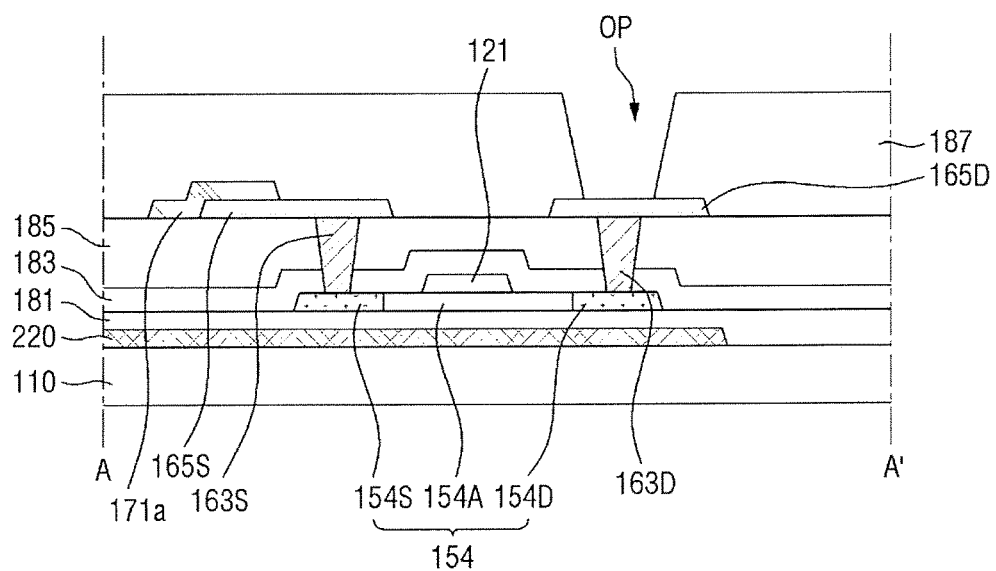

Referring to FIG. 15, the organic layer 187 may be disposed on the second insulating layer 185 on which the first data line 171a, the first conductive pattern 165S and the second conductive pattern 165D are formed. In the organic layer 187, the opening OP may be formed. The opening OP may expose the second conductive pattern 165D.

Figure 16:
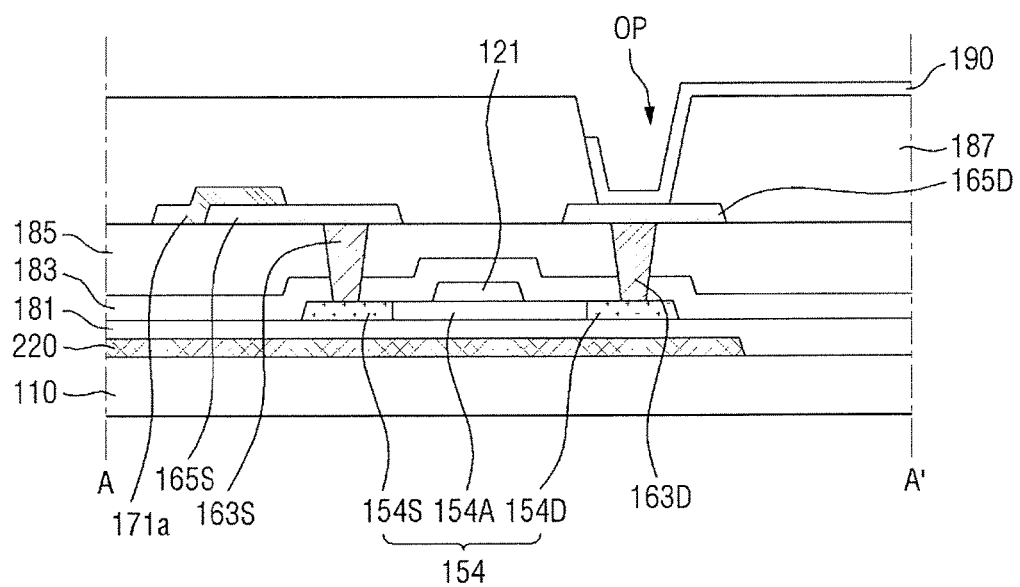

A transparent conductive material may be deposited on the organic layer 187. The transparent conductive material may be patterned to form the pixel electrode 190 as illustrated in FIG. 16. The pixel electrode 190 may be physically and/or electrically connected to the second conductive pattern 165D through the opening OP.

Thus, the first display substrate 100 of FIGS. 2 and 3 may be manufactured. The display device according to an exemplary embodiment of the present invention maybe manufactured by combining the first display substrate 100 of FIGS. 2 and 3 and the second display substrate 200 of FIGS. 2 and 3 and forming the liquid crystal layer 300 of FIG. 2 and FIG. 3 between the first display substrate 100 and the second display substrate 200.

Figure 17:
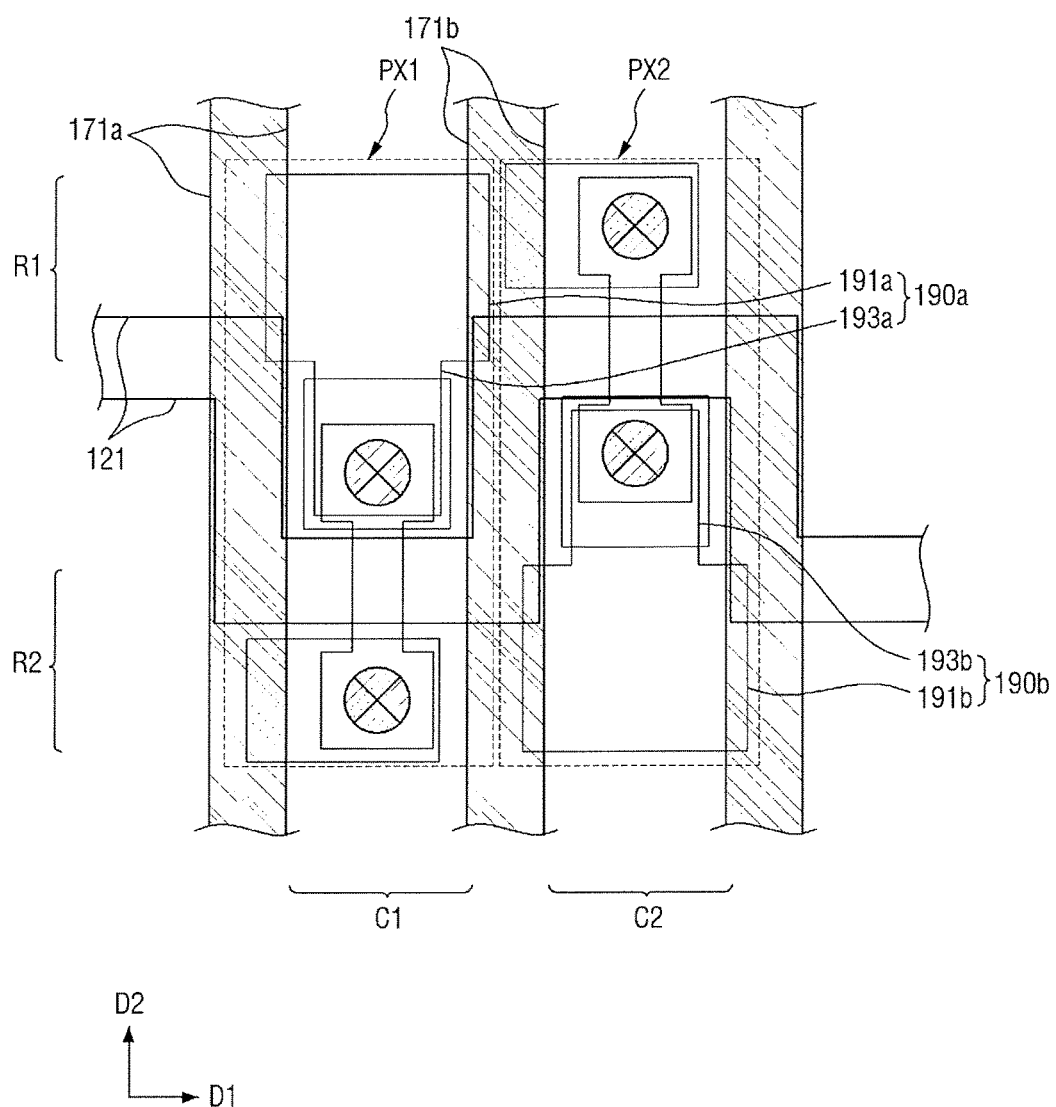
FIG. 17 is a schematic plan view of two adjacent pixels in a display device according to an exemplary embodiment of the present invention.

FIG. 17 is a schematic plan view illustrating adjacent neighboring pixels in a display device according to an exemplary embodiment of the present invention.

Referring to FIG. 17, a first pixel PX1 and a second pixel PX2 may be adjacent to each other along the first direction D1. The first pixel PX1 may be connected to the first data line 171a and the gate line 121. The second pixel PX2 may be connected to the second data line 171b and the gate line 121. The first pixel PX1 and the second pixel PX2 may be connected to the gate line 121. The first pixel PX1 and the second pixel PX2 may be adjacent to each other along the first direction D1. The first direction D1 may be the extending direction of the gate line 121.

Since the structure of the first pixel PX1 may be substantially the same as described with reference to FIGS. 1 to 3 and the structure of the second pixel PX2 may be substantially the same as the structure of the first pixel PX1, a detailed description thereof may be omitted.

The first pixel PX1 and the second pixel PX2 may have a substantially symmetrical shape. For example, the first pixel PX1 and the second pixel PX2 may be formed in a line-symmetrical shape with respect to an imaginary line. The imagery line may extend along the first direction D1.

A first pixel electrode 190a of the first pixel PX1 and a second pixel electrode 190b of the second pixel PX2 may be formed in a line-symmetrical shape with respect to an imaginary line. The imagery line may extend along the first direction D1.

The first pixel electrode 190a may include a first body portion 191a and a first connection portion 193a. The second pixel electrode 190b may include a second body portion 191b and a second connection portion 193b.

The first body portion 191a of the first pixel electrode 190a and the second body portion 191b of the second pixel electrode 190b may be located in different rows and different columns.

For example, when the first body portion 191a is located in a first row R1, the second body portion 191b might not be located in the first row R1. For example, the second body portion 191b may be located in a second row R2 along the second direction D2. The first row R1 may be adjacent to the second row R2. Further, when the first body part 191a is located in a first column C1, the second body portion 191b might not be located in the first column C1. For example, the second body portion 191b may be located in a second column C2 along the first direction D1. The second column C2 may be adjacent to the first column C1.

The first body portion 191a and the second body portion 191b might not be disposed adjacent to each other along the first direction D1 and the second direction D2. The first body portion 191a and the second body portion 191b may be disposed adjacent to each other along a diagonal direction. Accordingly, a distance between the adjacent pixel electrodes may be increased. Therefore, an electric field interference between the adjacent pixels and a motion interference of the liquid crystal molecules may be decreased.

While the present invention has been particularly shown and described with reference to exemplary embodiments thereof, these are merely examples and the present disclosure is not limited thereto. It will be understood by those of ordinary skill in the art that various changes in form and details may be made therein without departing from the spirit and scope of the present disclosure as defined by the following claims. For example, each component described in the exemplary embodiments of the present invention may be modified. Further, differences related to the modifications and applications should be understood as being included in the scope of the present invention as defined in the following claims.

What is claimed is:

1. A display device, comprising:
a first base portion;
a semiconductor layer disposed on the first base portion and including a source region, a drain region, and a channel region;
a first insulating layer disposed on the semiconductor layer;
a gate line disposed on the first insulating layer and overlapping the channel region, the gate line extending in a first direction;
a second insulating layer disposed on the gate line;
a first connection plug formed in the first insulating layer and the second insulating layer, the first connection plug filling a first connection hole exposing the source region;
a second connection plug formed in the first insulating layer and the second insulating layer, the second connection plug filling a second connection hole exposing the drain region;
a first conductive pattern disposed on the second insulating layer and connected to the first connection plug;
a second conductive pattern disposed on the second insulating layer, connected to the second connection plug, and spaced apart from the first conductive pattern;
a pixel electrode disposed on the second insulating layer and electrically connected to the first conductive pattern; and
a data line disposed on the second insulating layer and extending in a second direction intersecting the first direction, and electrically connected to the second conductive pattern,
wherein the first connection plug and the second connection plug are spaced apart from each other in the second direction while the gate line is interposed between the first connection plug and the second connection plug,
wherein an upper surface of the second connection plug is located on substantially a same plane as an upper surface of the second insulating layer,
wherein a lower surface of the second conductive pattern directly contacts the upper surface of the second connection plug and the upper surface of the second insulating layer, and
wherein the data line directly contacts an upper surface of the second conductive pattern and the upper surface of the second insulating layer.

2. The display device of claim 1, wherein the gate line has a zigzag shape.

3. The display device of claim 1, wherein the first connection plug and the second connection plug each include a first conductive material, wherein the first conductive pattern and the second conductive pattern each include a second conductive material, wherein the data line includes a third conductive material, and wherein the third conductive material is different from the second conductive material.

4. The display device of claim 3, wherein the data line is in contact with the first conductive pattern.

5. The display device of claim 3, wherein an upper surface of the first connection plug is located on substantially the same plane as an upper surface of the second insulating layer.

6. The display device of claim 3, wherein a height of the data line measured with respect to an upper surface of the first base portion is greater than a height of the first conductive pattern measured with respect to the upper surface of the first base portion.

7. The display device of claim 3, wherein the second conductive material is a transparent conductive material.

8. The display device of claim 7, wherein the third conductive material is substantially the same as the first conductive material.

9. The display device of claim 1, further comprising an organic layer disposed on the first conductive pattern and the second conductive pattern, the organic layer including an opening exposing the second conductive pattern, wherein the pixel electrode is disposed on the organic layer and in contact with the second conductive pattern through the opening.

10. The display device of claim 9, wherein the organic layer is a color filter.

11. The display device of claim 1, further comprising:
a light shielding layer disposed on the first base portion and overlapping the semiconductor layer; and
a buffer layer disposed on the light shielding layer, wherein the semiconductor layer is disposed on the buffer layer.

12. The display device of claim 11, wherein the light shielding layer includes an opaque metal.

13. The display device of claim 1, further comprising:
a second base portion facing the first base portion;
a common electrode disposed on a surface of the second base portion facing the first base portion; and
a liquid crystal layer disposed between the common electrode and the pixel electrode.

14. A method of manufacturing a display device, the method comprising:
  forming a semiconductor layer on a first base portion, the semiconductor layer including a source region, a drain region and a channel region;
  forming a first insulating layer on the semiconductor layer;
  forming a gate line on the first insulating layer and overlapping the channel region, the gate line extending in a first direction;
  forming a second insulating layer on the gate line;
  forming a first connection hole exposing the source region in the first insulating layer and the second insulating layer;
  forming a second connection hole exposing the drain region in the first insulating layer and the second insulating later;
  forming a first connection plug configured to fill the first connection hole and a second connection plug configured to fill the second connection hole using a damascene method;
  forming a first conductive pattern connected to the first connection plug on the second insulating layer;
  forming a second conductive pattern connected to the second connection plug on the second insulating layer;
  forming a data line on the second insulating layer configured to be connected to the first conductive pattern and extending in a second direction intersecting the first direction;
  forming an organic layer on the second insulating layer, the organic layer including an opening exposing the second connection plug; and
  forming a pixel electrode on the organic layer, the pixel electrode configured to be connected to the second connection plug,
  wherein the first connection plug and the second connection plug are spaced apart from each other in the second direction, and the gate line is disposed between the first connection plug and the second connection plug,
  wherein an upper surface of the second connection plug is located on substantially a same plane as an upper surface of the second insulating layer,
  wherein a lower surface of the second conductive pattern direct contacts the upper surface of the second connection plug and the upper surface of the second insulating layer, and
  wherein the data line directly contacts an upper surface of the second conductive pattern and the upper surface of the second insulating layer.

15. The method of claim 14, wherein the first connection plug and the second connection plug each include a first conductive material, wherein the first conductive pattern and the second conductive pattern each include a second conductive material, wherein the data line includes a third conductive material, and wherein the third conductive material is different from the second conductive material.

16. The method of claim 14, further comprising:
  forming a light shielding layer on the first base portion; and
  forming a buffer layer on the light shielding layer, wherein the semiconductor layer is formed on the buffer layer and overlaps the light shielding layer.

17. A display device, comprising:
  a first base portion;
  a semiconductor layer disposed on the first base portion, the semiconductor layer including a source region, a drain region, and a channel region;
  a first insulating layer disposed on the semiconductor layer;
  a gate line disposed on the first insulating layer;
  a second insulating layer disposed on the gate line;
  a first connection plug formed in the first insulating layer and the second insulating layer;
  a second connection plug formed in the first insulating layer and the second insulating layer;
  a first conductive pattern disposed on the second insulating layer;
  a second conductive pattern disposed on the second insulating layer and spaced apart from the first conductive pattern; and
  a data line disposed on the second insulating layer,
  wherein an upper surface of the first connection plug and an upper surface of the second connection plug are located on substantially a same plane as an upper surface of the second insulating layer,
  wherein the first connection plug and the second connection plug each include a first conductive material, the first conductive pattern and the second conductive pattern each include a second conductive material, and the data line includes a third conductive material different from the second conductive material,
  wherein a lower surface of the second conductive pattern directly contacts the upper surface of the second connection plug and the upper surface of the second insulating layer, and
  wherein the data line directly contacts an upper surface of the second conductive pattern and the upper surface of the second insulating layer.

18. The display device of claim 17, wherein the gate line has a zigzag shape.

19. The display device of claim 17, wherein the gate line overlaps the channel region of the semiconductor layer.

20. The display device of claim 17, wherein the first connection plug at least partially fills a first connection hole exposing the source region, and the second connection plug at least partially fills a second connection hole exposing the drain region.

* * * * *